US011158672B2

(12) United States Patent
Sonobe

(10) Patent No.: US 11,158,672 B2
(45) Date of Patent: Oct. 26, 2021

(54) MAGNETIC TUNNEL JUNCTION ELEMENTS AND MAGNETIC RESISTANCE MEMORY DEVICES INCLUDING THE SAME

(71) Applicant: Samsung Electronics Co., Ltd., Suwon-si (KR)

(72) Inventor: Yoshiaki Sonobe, Yokohama (JP)

(73) Assignee: Samsung Electronics Co., Ltd.

( * ) Notice: Subject to any disclaimer, the term of this patent is extended or adjusted under 35 U.S.C. 154(b) by 59 days.

(21) Appl. No.: 16/727,995

(22) Filed: Dec. 27, 2019

(65) Prior Publication Data

US 2020/0212104 A1 Jul. 2, 2020

(30) Foreign Application Priority Data

Dec. 28, 2018 (JP) .............................. JP2018-247076
Nov. 4, 2019 (KR) ........................ 10-2019-0139356

(51) Int. Cl.
*H01L 27/22* (2006.01)
*H01L 43/10* (2006.01)
*H01L 43/02* (2006.01)

(52) U.S. Cl.
CPC ............ *H01L 27/228* (2013.01); *H01L 43/02* (2013.01); *H01L 43/10* (2013.01)

(58) Field of Classification Search
CPC ........ H01L 27/228; H01L 43/02; H01L 43/10
See application file for complete search history.

(56) References Cited

U.S. PATENT DOCUMENTS 9,824,735 B1 * 11/2017 Kan ...................... G06F 7/588
2010/0074092 A1 * 3/2010 Zhu ...................... H01L 27/228
369/126

(Continued)

FOREIGN PATENT DOCUMENTS

JP 2016021468 2/2016
JP 2017059593 3/2017

(Continued)

OTHER PUBLICATIONS

Shang et al. "Technology Comparison for Large Last-Level Caches (L3Cs): Low-Leakage SRAM, Low Write-Energy STT-RAM, and Refresh-Optimized eDRAM" 2013 IEEE 19th International Symposium on High Performance Computer Architecture (HPCA) (12 pages) (Feb. 23-27, 2013).

(Continued)

*Primary Examiner* — Marc Anthony Armand
(74) *Attorney, Agent, or Firm* — Myers Bigel, P.A.

(57) ABSTRACT

A magnetic tunnel junction (MTJ) element includes a free layer, a pinned layer on the free layer, and a dielectric layer extending between the free layer and the pinned layer. A spin orbit torque (SOT) generator is provided, which contacts at least a portion of the free layer. A plane extending between the SOT generator and the free layer intersects a plane extending between the free layer and the dielectric layer. The SOT generator is configured to modulate current that passes between the free layer, the dielectric layer, and the pinned layer. This SOT generator can include a pair of electrodes that are spaced apart from each other in a direction orthogonal to a stacking direction of the free layer, the dielectric layer and the pinned layer. This SOT generator may include a metal selected from a group consisting of Pt, W, and Ta, or may include a topological insulator.

20 Claims, 7 Drawing Sheets

(56) References Cited

U.S. PATENT DOCUMENTS

| | | | |
|---|---|---|---|
| 2016/0276006 A1* | 9/2016 | Ralph | G11C 11/1675 |
| 2017/0076770 A1 | 3/2017 | Daibou et al. | |
| 2017/0077174 A1 | 3/2017 | Kondo et al. | |
| 2017/0077177 A1 | 3/2017 | Shimomura et al. | |
| 2017/0169872 A1 | 6/2017 | Yoda et al. | |
| 2017/0222135 A1 | 8/2017 | Fukami et al. | |
| 2017/0270985 A1 | 9/2017 | Shimomura et al. | |
| 2020/0006627 A1* | 1/2020 | Manipatruni | H01L 43/10 |

FOREIGN PATENT DOCUMENTS

| | | |
|---|---|---|
| JP | 2017059595 | 3/2017 |
| JP | 2017059634 | 3/2017 |
| JP | 2017059679 | 3/2017 |
| JP | 2017112351 | 6/2017 |
| JP | 6178451 | 8/2017 |

OTHER PUBLICATIONS

Fukami et al. "A spin-orbit torque switching scheme with collinear magnetic easy axis and current configuration" Nature Nanotechnology, vol. 11 (6 pages) (Mar. 21, 2016).

Fukami et al. "A spin-orbit torque switching scheme with collinear magnetic easy axis and current configuration" Supplementary Information, Nature Nanotechnology (27 pages) (Mar. 21, 2016).

Fukami et al. "A sub-ns three-terminal spin-orbit torque induced switching device" 2016 Symposium on VLSI Technology Digest of Technical Papers (2 pages) (Jun. 14-16, 2016).

Lee et al. "Thermally activated switching of perpendicular magnet by spin-orbit spin torque" Applied Physics Letters 104(7):1072413 (6 pages) (Feb. 21, 2014).

Liu et al. "Spin-Torque Ferromagnetic Resonance Induced by the Spin Hall Effect" American Physical Society 106(3):036601 (4 pages) (Jan. 20, 2011).

Liu et al. "Spin-Torque Switching with the Giant Spin Hall Effect of Tantalum" Science 336(6081):555-558 (4 pages) (May 4, 2012).

Watanabe et al. "Shape anisotropy revisited in single-digit nanometer magnetic tunnel junctions" Nature Communications 9(663) (6 pages) (Feb. 14, 2018).

Xiao et al. "Temperature dependence of interlayer coupling between perpendicular magnetic [CoFeB/Pd] multilayers Influence of interfacial CoFeB layer" Applied Physics Letters 104(7):072403 (6 pages) (Feb. 18, 2014).

Yoda et al. "Voltage-Control Spintronics Memory (VoCSM) Having Potentials of Ultra-Low Energy-Consumption and High-Density" 2016 IEEE International Electron Devices Meeting (IEDM) (4 pages) (Dec. 3-7, 2016).

* cited by examiner

MAGNETIC TUNNEL JUNCTION ELEMENTS AND MAGNETIC RESISTANCE MEMORY DEVICES INCLUDING THE SAME

REFERENCE TO PRIORITY APPLICATIONS

This U.S. non-provisional application claims priority under 35 U.S.C § 119 to Japanese Patent Application No. 2018-247076, filed Dec. 28, 2018 in the Japanese Intellectual Property Office, and Korean Patent Application No. 10-2019-0139356, filed Nov. 4, 2019 in the Korean Intellectual Property Office, the disclosures of which are hereby incorporated herein by reference.

BACKGROUND

The present inventive concepts relate to magnetic tunnel junction elements and magnetic resistance memory devices.

A magnetic resistance device having perpendicular magnetization is regarded as a next-generation memory because the magnetic resistance memory can be operated using a magnetoresistance effect and can have excellent thermal disturbance resistance against miniaturization.

The next-generation memory includes a magnetic tunnel junction (MTJ) element including a free layer whose magnetization direction is variable, a pinned layer whose magnetization direction is fixed, and a dielectric layer extending between the free layer and the pinned layer.

A spin transfer torque magnetoresistive random access memory (STT-M RAM) based on MTJ has been put to practical use. The STT-MRAM has a two-terminal structure and the same path for write and read currents. The STT-MRAM has a low conversion efficiency from write current to spin current and also has difficulty in achieving low current and high operating speed. For example, when a free layer of the STT-M RAM is 10 nm in width, 10 nm in length, and 1 nm in thickness, the number of electrons in the free layer is approximately 105. Because the conversion efficiency from write current to spin current is theoretically equal to or less than 1, the same number of electrons is required to be injected to inverse spins of electrons. Therefore, when it is assumed that a switching time of 3 ns is needed for spin inversion, one MTJ element requires a write current of about 10 µA or more. But, read and write currents are typically insufficient in margin.

As one approach to solve the problems, a spin orbit torque (SOT) writing scheme has been proposed. When the SOT writing scheme is employed, because the conversion efficiency from write current to spin current can be theoretically equal to or greater than 1, it is possible to implement low-current writing and rapid operation. However, to utilize the SOT, it is requested that a device structure have three terminals and a longitudinal magnetic layer be used instead of a perpendicular magnetic layer. In addition, because it is necessary to newly add a magnetic-field generator, the device structure can become complicated.

SUMMARY

Example embodiments of the present inventive concepts can provide a magnetic tunnel junction element and a magnetic resistance memory device having simplified device structure, low write power, rapid write operation, and high reliability.

According to some example embodiments of the present inventive concepts, a magnetic tunnel junction element may include: a free layer, a pinned layer on the free layer, a dielectric layer between the free layer and the pinned layer, and a spin orbit torque (SOT) generator in contact with a lateral surface of the free layer. A plane where the SOT generator and the free layer are in contact with each other may intersect a plane where the free layer and the dielectric layer are in contact with each other. The SOT generator may be configured to allow current to flow in a direction that intersects a stacking direction of the free layer, the dielectric layer, and the pinned layer.

According to some example embodiments of the present inventive concepts, a magnetic resistance memory device may include: a magnetic tunnel junction element, and a plurality of electrodes that provide the magnetic tunnel junction element with voltage. The magnetic tunnel junction element may include: a free layer, a pinned layer on the free layer, a dielectric layer between the free layer and the pinned layer, and a spin orbit torque (SOT) generator in contact with a lateral surface of the free layer. A plane where the SOT generator and the free layer are in contact with each other may intersect a plane where the free layer and the dielectric layer are in contact with each other. The SOT generator may be configured to allow current to flow in a direction that intersects a stacking direction of the free layer, the dielectric layer, and the pinned layer.

DETAILED DESCRIPTION OF EMBODIMENTS

Figure 1:
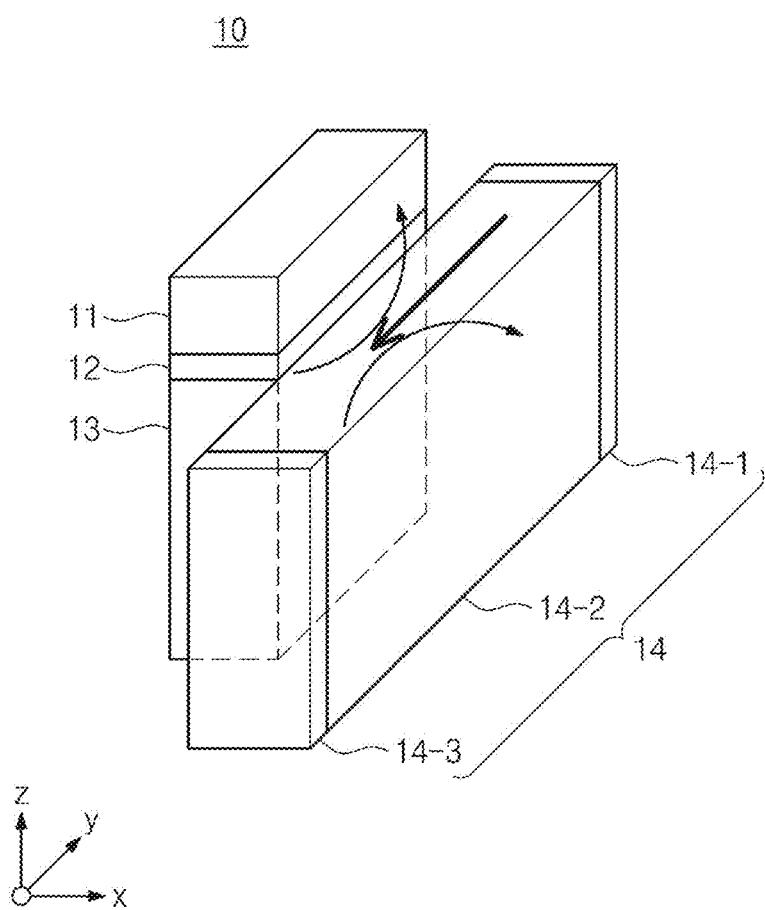
FIG. 1 illustrates a simplified perspective view showing a configuration of a magnetic tunnel junction element according to an embodiment of the present inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a simplified perspective view showing a configuration of a magnetic tunnel junction element according to an embodiment of the invention. As shown by FIG. 1, a magnetic tunnel junction element 10 includes a pinned layer 11, a dielectric layer 12, a free layer 13, and a spin orbit torque (SOT) generator 14. The pinned layer 11 has a magnetization direction that is fixed regardless of whether current is flowing or not. The pinned layer 11 preferably includes a material whose magnetization direction is not easily changeable compared to the free layer 13. For example, the pinned layer 11 can include a material having a relatively high effective magnetic anisotropy ($K_{u,eff}$), a relatively high saturation magnetization ($M_s$), and/or a relatively large magnetic relaxation coefficient ($\alpha$), in some embodiments of the invention. The material of the pinned layer 11, however, is not limited thereto and may be selected based on one or more alternative conditions and properties. For example, the pinned layer 11 may be made of a Co/Pt multi-layer and a layer whose main constituent is CoFeB. As another example, the pinned layer 11 may be made of a Co/Pt multi-layer and a layer mainly containing a Heusler alloy. Preferably, in some embodiments of the invention, the layer mainly containing a Heusler alloy has a Co-based full-Heusler alloy as a main constituent. For example, the Co-based Heusler alloy may be $Co_2FeSi$, $Co_2MnSi$, $Co_2FeMnSi$, $Co_2FeAl$, or $Co_2CrAl$. The Co/Pt multi-layer is configured to have high perpendicular magnetic anisotropy. The layer mainly containing a Heusler alloy is in contact with the dielectric layer 12 at one surface thereof, and is in contact with the Co/Pt multi-layer at another surface thereof (e.g., opposite to the one surface in contact with the dielectric layer 12). The pinned layer 11 may be configured, as a single layer, to maintain its magnetization direction in a specific direction regardless of current flow. The pinned layer 11 may also be referred to as a reference layer.

As shown by FIG. 1, the dielectric layer 12 may be provided between the pinned layer 11 and the free layer 13. The dielectric layer 12 can include a dielectric material as a main constituent. For example, the dielectric layer 12 may be made of a dielectric layer including MgO. The material of the dielectric layer 12 can be, in some embodiments of the invention, a NaCl-structured oxide. As another example, the material of the dielectric layer 12 may be CaO, SrO, TiO, VO, or NbO. The aforementioned material of the dielectric layer 12 is exemplary, and is not limited thereto. For example, the dielectric layer 12 may be spinel-type $MgAl_2O_4$.

A voltage can be perpendicularly applied to a contact surface between the pinned layer 11 and the free layer 13, and thus a tunneling effect may cause the production of a current flow through the magnetic tunnel junction element 10. The free layer 13 has a magnetization direction that is variable due to the current flow. The free layer 13 has a magnetization easy axis that is perpendicular to a top surface of the free layer 13. For example, the free layer 13 can be magnetized in a direction perpendicular to the top surface of the free layer 13. The magnetization easy axis indicates an axis directed in a direction along which a magnetic substance is easily magnetized. The free layer 13 can have a variable magnetization direction. The magnetization direction of the free layer 13 may be directed upwards or downwards from the top surface of the free layer 13. Preferably, a material of the free layer 13 may be selected based on various conditions. For example, the free layer 13 may include CoFeB as a main constituent. The free layer 13 may also include a Co-based Heusler alloy. The Co-based Heusler alloy may be, for example, $Co_2FeSi$, $Co_2MnSi$, $Co_2FeMnSi$, $Co_2FeAl$, or $Co_2CrAl$. The free layer 13 may also be referred to as a write layer, a magnetization free layer, or a magnetization variable layer.

The SOT generator 14 may be provided in contact with a lateral surface of the free layer 13. For example, the SOT generator 14 may be in contact with a lateral surface of the free layer 13, and the lateral surface may be parallel to a YZ-plane. In this case, the YZ-plane, where the SOT generator 14 and the free layer 13 are in contact with each other, may intersect an XY-plane where the dielectric layer 12 and the free layer 13 are in contact with each other. The SOT generator 14 may generate a spin orbit torque that can operate to switch the magnetization direction of the free layer 13. The SOT generator 14 does not necessarily need to contact the pinned layer 11 and typically has no effect on the magnetization direction of the pinned layer 11. The SOT generator 14 may be configured to allow current to flow in a direction that intersects a stacking direction of the free layer 13, the dielectric layer 12, and the pinned layer 11.

In this description, a Z-axis direction of FIG. 1 is the stacking direction of the free layer 13, the dielectric layer 12, and the pinned layer 11. A current may flow through the SOT generator 14 in a direction intersecting the Z-axis direction. The current flowing through the SOT generator 14 generates the Spin Orbit Torque (SOT). In this description, the term "intersecting" can mean non-parallel, because a current direction through the SOT generator 14 may not be parallel to the stacking direction of the free layer 13, the dielectric layer 12, and the pinned layer 11. For example, an intersection angle of greater than 0° and less than 360° may be provided between the current direction through the SOT generator 14 and the stacking direction of the free layer 13, the dielectric layer 12, and the pinned layer 11. To efficiently switch the magnetization direction of the free layer 13 by using a generated spin current, the intersection angle is preferably 45° or more, but more preferably greater than about 80°. Even more preferably, the intersection angle can be a "right" angle between about 88° and about 92°.

The SOT generator 14 includes a first coupling terminal 14-1, an SOT connection line 14-2, and a second coupling terminal 14-3. When a current flows in series from the first coupling terminal 14-1, through the SOT connection line 14-2, to the second coupling terminal 14-3, the SOT generator 14 may generate spin orbit torque, as a force, on the free layer 13. The first coupling terminal 14-1 and the second coupling terminal 14-3 are preferably spaced apart from the free layer 13, but the SOT connection line 14-2 can have a Y-axis direction length preferably the same as (or greater than) the free layer 13.

Although not wishing to be bound by any theory, the SOT generator 14 may have a structure that allows current to flow in a direction intersecting the stacking direction of the free layer 13, the dielectric layer 12, and the pinned layer 11. For example, the first coupling terminal 14-1 and the second coupling terminal 14-3 may be a pair of electrodes that are spaced apart from each other in a direction intersecting the stacking direction of the free layer 13, the dielectric layer 12, and the pinned layer 11. As shown by FIG. 1, the first coupling terminal 14-1 and the second coupling terminal 14-3 are disposed on opposite ends in the Y-axis direction of the SOT connection line 14-2, and the first coupling terminal 14-1 and the second coupling terminal 14-3 may include a conductive material in some embodiments of the invention.

The SOT connection line 14-2 includes a material that is capable of providing a current between the first coupling terminal 14-1 and the second coupling terminal 14-3, to thereby generate a sufficient spin-orbit-torque (S-O-T) to the free layer 13. In some embodiment of the invention, the SOT connection line 14-2 may include a topological insulator (TI), which is a material that behaves as an insulator in its interior but permits a current flow on its surface. For example, the topological insulator may be half-metal bismuth or a bismuth compound. In particular, either BiTeSb or BiSb is extremely appropriate to use as the topological insulator. On the other hand, a change in composition may provide conductivity into the interior of the topological insulator. The SOT connection line 14-2 may include at least one metal such as Pt, W, and Ta.

As shown by FIG. 1, the SOT connection line 14-2 may have a top surface in the Z-axis, and the top surface of the SOT connection line 14-2 may be spaced apart from a bottom surface of the pinned layer 11. For example, the top surface of the SOT connection line 14-2 may be located at a lower level than that of the bottom surface of the pinned layer 11. Therefore, the top surface of the SOT connection line 14-2 may not be in contact with the bottom surface of the pinned layer 11. For example, the top surface of the SOT connection line 14-2 may be positioned at substantially the same level as that of a bottom surface of the dielectric layer 12, as illustrated by FIG. 1.

Figure 2:
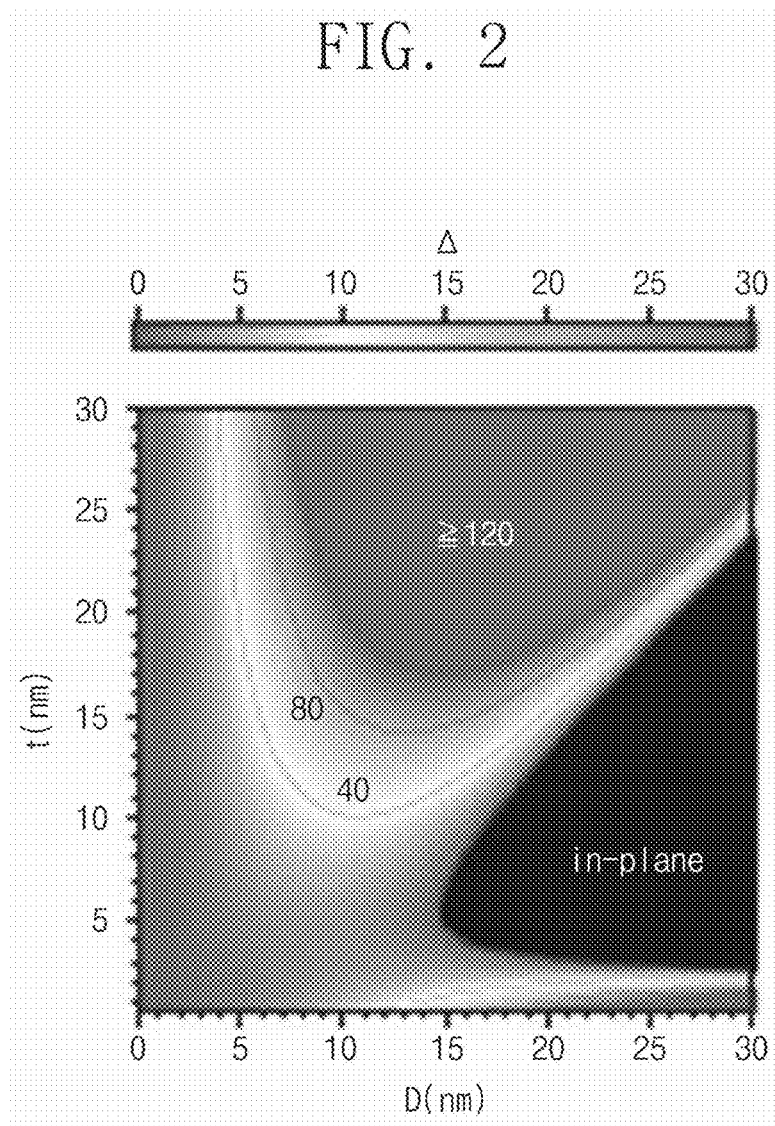
FIG. 2 illustrates a graph showing a relationship between thermal stability and a structure of an MTJ element.

A comparative example is introduced to discuss the relative thermal stability of the magnetic tunnel junction element 10 of FIG. 1. In particular, FIG. 2 illustrates a graph showing a relationship between thermal stability and a structure of a magnetic tunnel junction (MTJ) element. To be specific, FIG. 2 depicts a graph showing a thermal stability factor Δ that is measured in accordance with a combination of thickness t (y-axis, nanometers) and diameter D (x-axis, nanometers) of the MTJ element. For example, when the MTJ element has a cylindrical shape, the diameter D of the MTJ element indicates a diameter of a bottom surface of the MTJ element. In FIG. 2, a vertical axis denotes the thickness t of the MTJ element, and a lower horizontal axis expresses the diameter D of the MTJ element. Moreover, in FIG. 2, an upper horizontal axis refers to the thermal stability factor Δ, which ranges from 0 to 30 (dimensionless).

Referring to FIG. 2, when the MTJ element is configured such that a combination of the thickness and diameter increases the thermal stability Δ, the MTJ element is suitable to perform a SOT-based write operation. For example, as shown in FIG. 2, it is preferable that the combination of the thickness and the diameter cause the thermal stability Δ to increase to 40 or higher, and more preferably to 80 or higher, and most preferably to 120 or higher.

Referring back to FIG. 1, the magnetic tunnel junction element 10 is configured such that the SOT generator 14 is disposed on a lateral surface of the free layer 13 and that a current flows along a lateral surface of the SOT generator 14. As such, the magnetic tunnel junction element 10 may be provided with a simplified structure, low write power, rapid write operation, and high reliability. In addition, the magnetic tunnel junction element 10 is configured such that the free layer 13 may have an elongated shape in the Z-axis direction, and the shape of the magnetic anisotropy may be used to secure thermal stability. The shape of the magnetic anisotropy is magnetic anisotropy where physical characteristics of a magnetic substance depend on shape and structure.

A magnetic substance having the shape magnetic anisotropy is easily magnetized when a magnetic field is applied in a direction (e.g., in-plane direction of a thin layer) in which an anti-magnetic field is produced, but not easily magnetized when a magnetic field is applied in a direction (e.g., perpendicular to a surface of a thin layer) in which a large anti-magnetic field is produced. Because the free layer 13 has an elongated shape in the Z-axis direction in the magnetic tunnel junction element 10, no anti-magnetic field is produced and perpendicular magnetization may be stabilized. In contrast, conventional STT write layers or SOT write layers are not suitable for elongated shapes in the Z-axis direction.

In addition, a height in the Z-axis direction of the free layer 13 is preferably of about 15 nm to about 20 nm. When the free layer 13 has the desired height in the Z-axis direction, even though each of the widths in the X- and Y-axis directions of the magnetic tunnel junction element 10 is equal to or less than about 10 nm, thermal stability may be secured to achieve high density. An SOT technique may be employed to increase conversion efficiency from current to spin current. Accordingly, the magnetic tunnel junction element 10 may be provided to have rapid write operation (e.g., less than 10 ns), lower power, high reliability, and little to no deterioration of thermal stability even in extensive operating temperatures between about −40° C. and about +150° C. Further, the magnetic tunnel junction element 10 may be implemented even when no external magnetic field is present.

Figure 3:
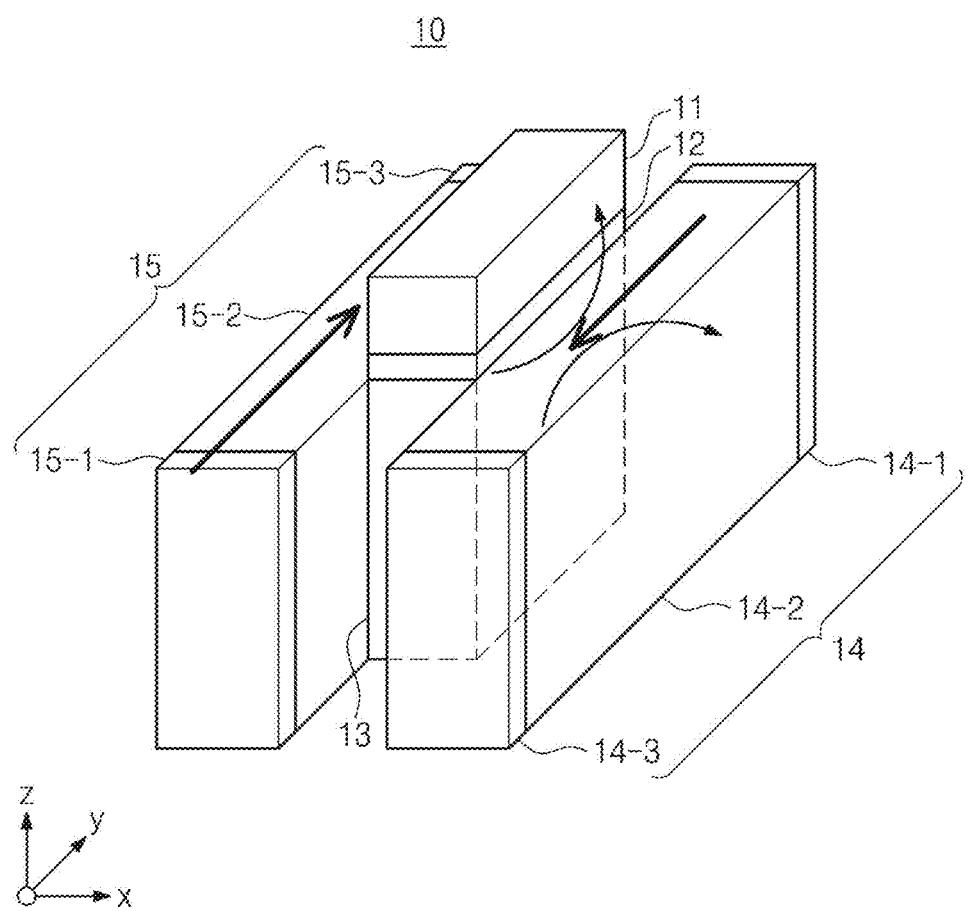
FIG. 3 illustrates a simplified perspective view showing a configuration of a magnetic tunnel junction element according to an embodiment of the present inventive concepts.

Referring now to FIG. 3, a magnetic tunnel junction element 10 is provided, in which a pair of SOT generators are disposed on opposite lateral surfaces of a free layer and in which a direction of current flowing through one SOT generator is opposite to that of current flowing through other SOT generator. As shown, a magnetic tunnel junction element 10 includes a pinned layer 11, a dielectric layer 12, a free layer 13, a first SOT generator 14, and a second SOT generator 15. In FIG. 3, the same component as that of FIG. 1 is allocated the same reference numeral thereto, and a description thereof is omitted.

Referring to FIG. 3, the first SOT generator 14 is similarly configured to the SOT generator 14 of FIG. 1. The second SOT generator 15 may generate a spin orbit torque that switches the magnetization direction of the free layer 13. The second SOT generator 15 includes a third coupling terminal 15-1, an SOT connection line 15-2, and a fourth coupling terminal 15-3. The SOT connection line 15-2 has the same configuration as that of the SOT connection line 14-2. The third coupling terminal 15-1 and the fourth coupling terminal 15-3 are identically configured to the first coupling terminal 14-1 and the second coupling terminal 14-3, respectively.

When a current flows from the third coupling terminal 15-1 through the SOT connection line 15-2 to the fourth coupling terminal 15-3, the second SOT generator 15 may generate a sufficient spin orbit torque (SOT). For example, the second SOT generator 15 is configured to allow current to flow in a direction that intersects a stacking direction of the free layer 13, the dielectric layer 12, and the pinned layer 11, thereby generating the spin orbit torque. In this description, a Z-axis direction of FIG. 3 is the stacking direction of the free layer 13, the dielectric layer 12, and the pinned layer 11. A plane where the second SOT generator 15 is in contact with the free layer 13 intersects a plane where the dielectric layer 12 is in contact with the free layer 13. A direction of current flowing through the second SOT generator 15 is parallel to but opposite to that of current flowing through the first SOT generator 14. To achieve the current flow mentioned above, the first SOT generator 14 and the second SOT generator 15 have the free layer 13 therebetween and are disposed parallel to each other.

For example, on the first SOT generator 14, a current flows from the first coupling terminal 14-1 through the SOT connection line 14-2 to the second coupling terminal 14-3; and on the second SOT generator 15, a current flows from the third coupling terminal 15-1 through the SOT connection line 15-2 to the fourth coupling terminal 15-3. Accordingly, the first SOT generator 14 and the second SOT generator 15 may each generate respective spin orbit torques, but these spin orbit torques do not necessarily fully counterbalance each other on the free layer 13.

According to the magnetic tunnel junction element 10 in accordance with the embodiment of FIG. 3, the first SOT generator 14 is in contact with one lateral surface of the free layer 13, and the second SOT generator 15 is in contact with another lateral surface of the free layer 13, which another lateral surface is parallel to the one lateral surface. The first SOT generator 14 and the second SOT generator 15 may have the same composition. Because the respective spin orbit torques (SOT) are generated at opposite sides of the free layer 13, the net generated torque may be about twice torque generated in a case where an SOT generator is disposed below the free layer 13. According to the magnetic tunnel junction element 10 in accordance with the embodiment of FIG. 3, the first SOT generator 14 and the second SOT generator 15 may be disposed on lateral surfaces of the free layer 13. For example, a plurality of SOT generators 14 and 15 may be disposed on a single free layer 13.

Figure 4:
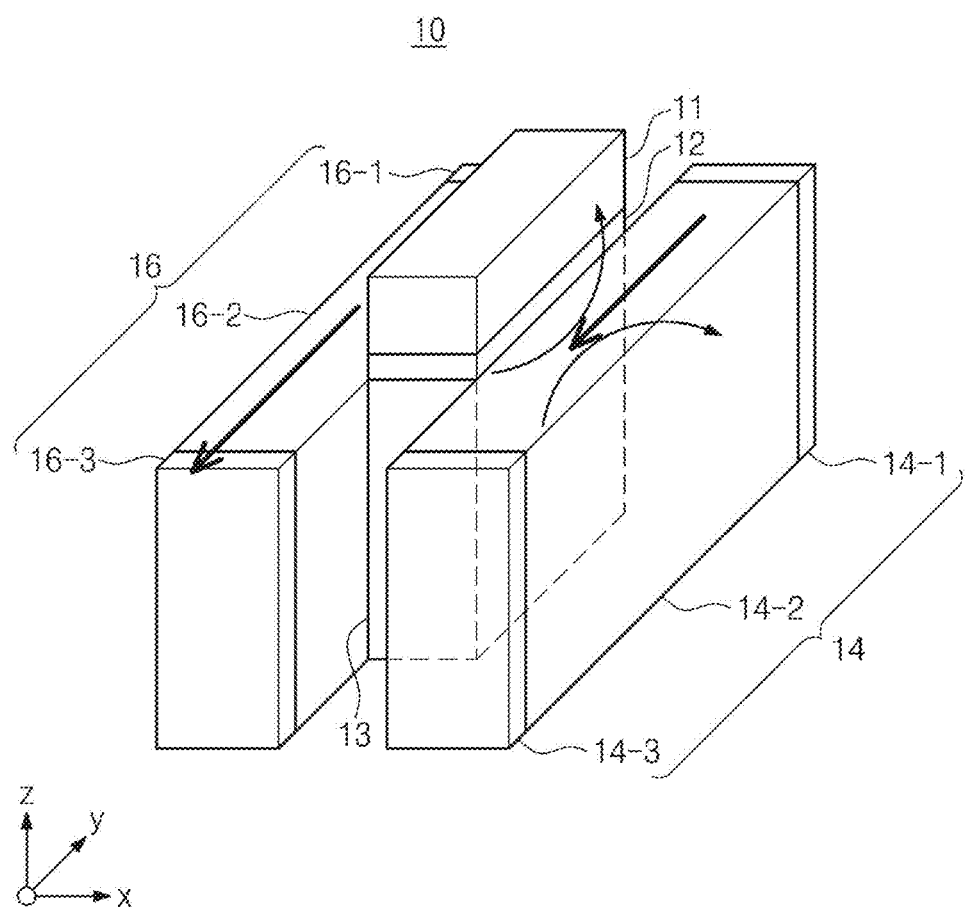
FIG. 4 illustrates a simplified perspective view showing a configuration of a magnetic tunnel junction element according to an embodiment of the present inventive concepts.

Referring now to FIG. 4, another embodiment of the invention includes a magnetic tunnel junction element 10 in which SOT generators 14, 16 are disposed on opposite lateral surfaces of a free layer, and in which a direction of current flowing through one SOT generator 14 is the same as that of current flowing through other SOT generator 16. In particular, FIG. 4 illustrates a simplified perspective view showing a configuration of the magnetic tunnel junction element 10, which is similar to the embodiment of FIG. 3. Thus, FIG. 4 illustrates a magnetic tunnel junction element 10, which includes a pinned layer 11, a dielectric layer 12, a free layer 13, a first SOT generator 14, and a third SOT generator 16. This third SOT generator 16 may generate a spin orbit torque that switches the magnetization direction of the free layer 13. As shown, the third SOT generator 16 may include a third coupling terminal 16-1, an SOT connection line 16-2, and a fourth coupling terminal 16-3. The SOT connection line 16-2 may be made of a composition which causes that a direction or sign of SOT due to current flowing through the SOT connection line 16-2 is opposite to that of SOT due to current flowing through the SOT connection line 14-2. For example, the SOT connection line 14-2 may include Pt, and the SOT connection line 16-2 may include Ta. The third coupling terminal 16-1 and the fourth coupling terminal 16-3 may be configured identically to the first coupling terminal 14-1 and the second coupling terminal 14-3, respectively, in some embodiments of the invention.

When a current flows from the third coupling terminal 16-1 through the SOT connection line 16-2 to the fourth coupling terminal 16-3, the third SOT generator 16 may generate a spin orbit torque. For example, the third SOT generator 16 may be configured to allow current to flow in a direction that intersects a stacking direction of the free layer 13, the dielectric layer 12, and the pinned layer 11, thereby generating the spin orbit torque. In this description, a Z-axis direction of FIG. 4 is the stacking direction of the free layer 13, the dielectric layer 12, and the pinned layer 11. A plane where the third SOT generator 16 is in contact with the free layer 13 intersects a plane where the dielectric layer 12 is in contact with the free layer 13.

A direction of current flowing through the third SOT generator 16 is parallel to and may be identical to that of current flowing through the first SOT generator 14. To achieve the current flow discussed above, the first SOT generator 14 and the third SOT generator 16 have the free layer 13 therebetween and may be disposed parallel to each other. For example, on the first SOT generator 14, a current flows from the first coupling terminal 14-1 through the SOT connection line 14-2 to the second coupling terminal 14-3, and on the third SOT generator 16, a current flows from the third coupling terminal 16-1 through the SOT connection line 16-2 to the fourth coupling terminal 16-3. Owing to the current flow mentioned above, the first SOT generator 14 and the third SOT generator 16 may each generate respective spin orbit torques, which do not necessarily fully counterbalance each other on the free layer 13.

According to the magnetic tunnel junction element 10 in accordance with the embodiment of FIG. 4, the first SOT generator 14 is in contact with one lateral surface of the free layer 13, and the third SOT generator 16 is in contact with another lateral surface of the free layer 13, which is parallel to the one lateral surface. The first SOT generator 14 and the third SOT generator 16 can have different compositions from each other, and thus the degree of freedom of write current flow may increase to facilitate design of magnetic resistance memory.

Figure 5:
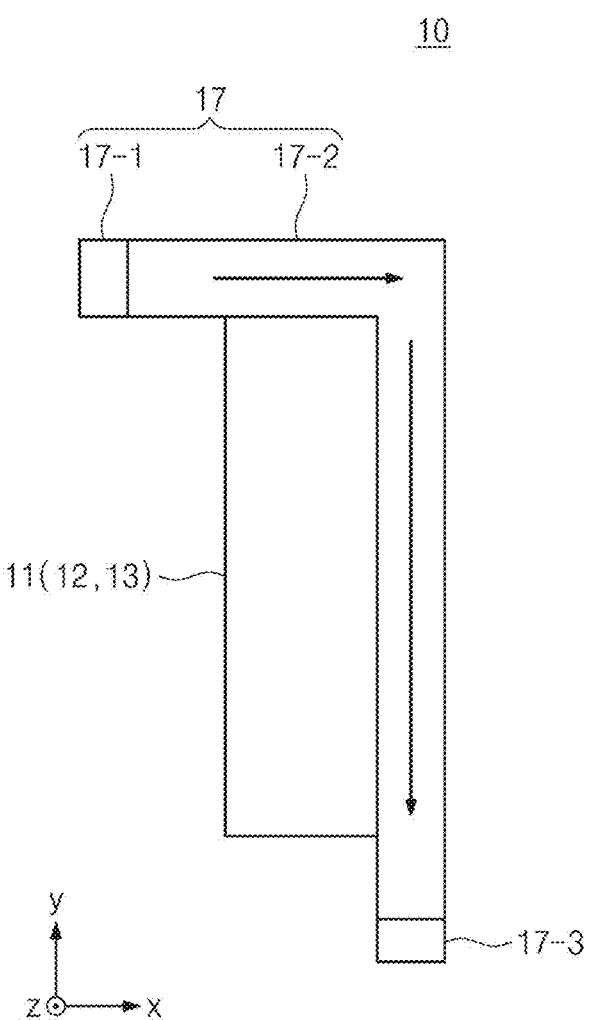
FIG. 5 illustrates a simplified top view showing a configuration of a magnetic tunnel junction element according to an embodiment of the present inventive concepts.

According to another embodiment of the invention, a magnetic tunnel junction element is provided, which includes a plurality of SOT generators. These generators are disposed on lateral surfaces of a free layer, and the currents flowing through the SOT generators intersect each other. In particular, FIG. 5 illustrates a simplified top view showing a configuration of the magnetic tunnel junction element according to an embodiment of the invention. This magnetic tunnel junction element 10 includes a pinned layer 11, a dielectric layer 12, a free layer 13, and a fourth SOT generator 17. In FIG. 5, the same components as that of FIG. 1 are allocated with the same reference numerals, and a description thereof is omitted. Referring to FIGS. 1 and 5, the fourth SOT generator 17 is configured to generate a spin orbit torque that switches the magnetization direction of the free layer 13. The fourth SOT generator 17 includes a first coupling terminal 17-1, an L-shaped SOT connection line 17-2, and a second coupling terminal 17-3. The SOT connection line 17-2 has the same material configuration as that of the SOT connection line 14-2 of FIGS. 1, 3 and 4. The first coupling terminal 17-1 and the second coupling terminal 17-3 of FIG. 5 are respectively configured identically to the first coupling terminal 14-1 and the second coupling terminal 14-3 of FIGS. 1, 3 and 4. When a current flows from the first coupling terminal 17-1 through the L-shaped SOT connection line 17-2 to the second coupling terminal 17-3, the fourth SOT generator 17 may generate the spin orbit torque. For example, the fourth SOT generator 17 can be configured to allow current to flow in a direction that intersects a stacking direction of the free layer 13, the dielectric layer 12, and the pinned layer 11, thereby generating a desired spin orbit torque. The stacking direction is the Z-axis direction of FIG. 5. And, the YZ- and ZX-planes, where the fourth SOT generator 17 is in contact with the free layer 13, intersect an XY-plane where the dielectric layer 12 is in contact with the free layer 13.

A direction of current flowing through the fourth SOT generator 17 includes the X- and Y-axis directions indicated by the arrows of FIG. 5. In particular, a current flows from the first coupling terminal 17-1 through the SOT connection line 17-2 to the second coupling terminal 17-3. But, owing to the current flow discussed above, the fourth SOT generator 17 may generate spin orbit torques, and the spin orbit torques do not necessarily fully counterbalance each other on the free layer 13.

According to the embodiment of FIG. 5, the magnetic tunnel junction element 10 may be configured to increase the magnitude of SOT, compared to a case where an SOT generator is disposed below the free layer 13; therefore, the magnetic tunnel junction element 10 of FIG. 5 may be constructed such that the fourth SOT generator 17 may be disposed on a plurality of lateral surfaces of the free layer 13, thereby increasing the magnitude of SOT.

Figure 6:
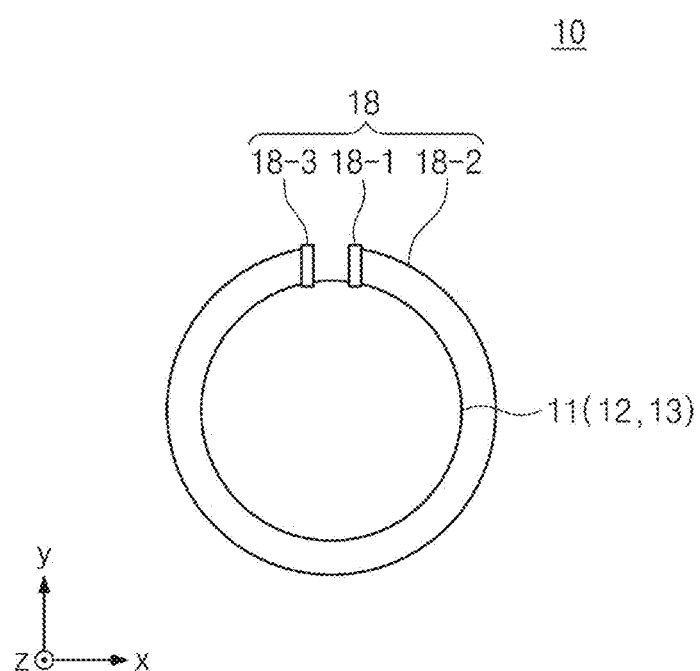
FIG. 6 illustrates a simplified top view showing a configuration of a magnetic tunnel junction element according to an embodiment of the present inventive concepts.

Referring now to FIG. 6, a magnetic tunnel junction element 10 includes a pinned layer 11, a dielectric layer 12, a free layer 13, and a fifth SOT generator 18. In particular, FIG. 6 illustrates a simplified top view showing a configuration of the magnetic tunnel junction element 10. As shown by FIG. 6, the free layer 13 has a cylindrical shape, which extends in a Z-axis direction. The fifth SOT generator 18 is configured to surround a lateral surface of the free layer 13, and has a partial annular shape, as shown. The fifth SOT generator 18 is configured to generate a spin orbit torque that switches the magnetization direction of the free layer 13. The fifth SOT generator 18 includes a first coupling terminal 18-1, a ring-shaped SOT connection line 18-2, and a second coupling terminal 18-3. The SOT connection line 18-2 may have the same composition as that of the SOT connection lines of FIGS. 1 and 3-4. And, the first coupling terminal 18-1 and the second coupling terminal 18-3 may be configured to have the same composition respectively as that of the first coupling terminal 14-1 and the second coupling terminal 14-3 of FIGS. 1 and 3-4.

When a current flows from the first coupling terminal 18-1 through the SOT connection line 18-2 to the second coupling terminal 18-3, the fifth SOT generator 18 may generate a desired spin orbit torque. For example, the fifth SOT generator 18 can be configured to allow current to flow in a direction that intersects a stacking direction of the free layer 13, the dielectric layer 12, and the pinned layer 11 and that circumferentially surrounds the free layer 13, thereby generating the spin orbit torque. In this description, the Z-axis direction of FIG. 6 is the stacking direction of the free layer 13, the dielectric layer 12, and the pinned layer 11. A plane where the fifth SOT generator 18 is in contact with the free layer 13 intersects a plane where the dielectric layer 12 is in contact with the free layer 13.

In addition, opposite ends of the partial annular shape SOT generator 18 are not limited to circular shapes. For example, the opposite ends of the partial annular shape may have polygonal shapes. In addition, the partial annular shape is not limited to a form that surrounds almost a perimeter of the free layer 13. For example, the partial annular shape may have a form that surrounds half the perimeter of the free layer 13, in some embodiments of the invention.

Figure 7:
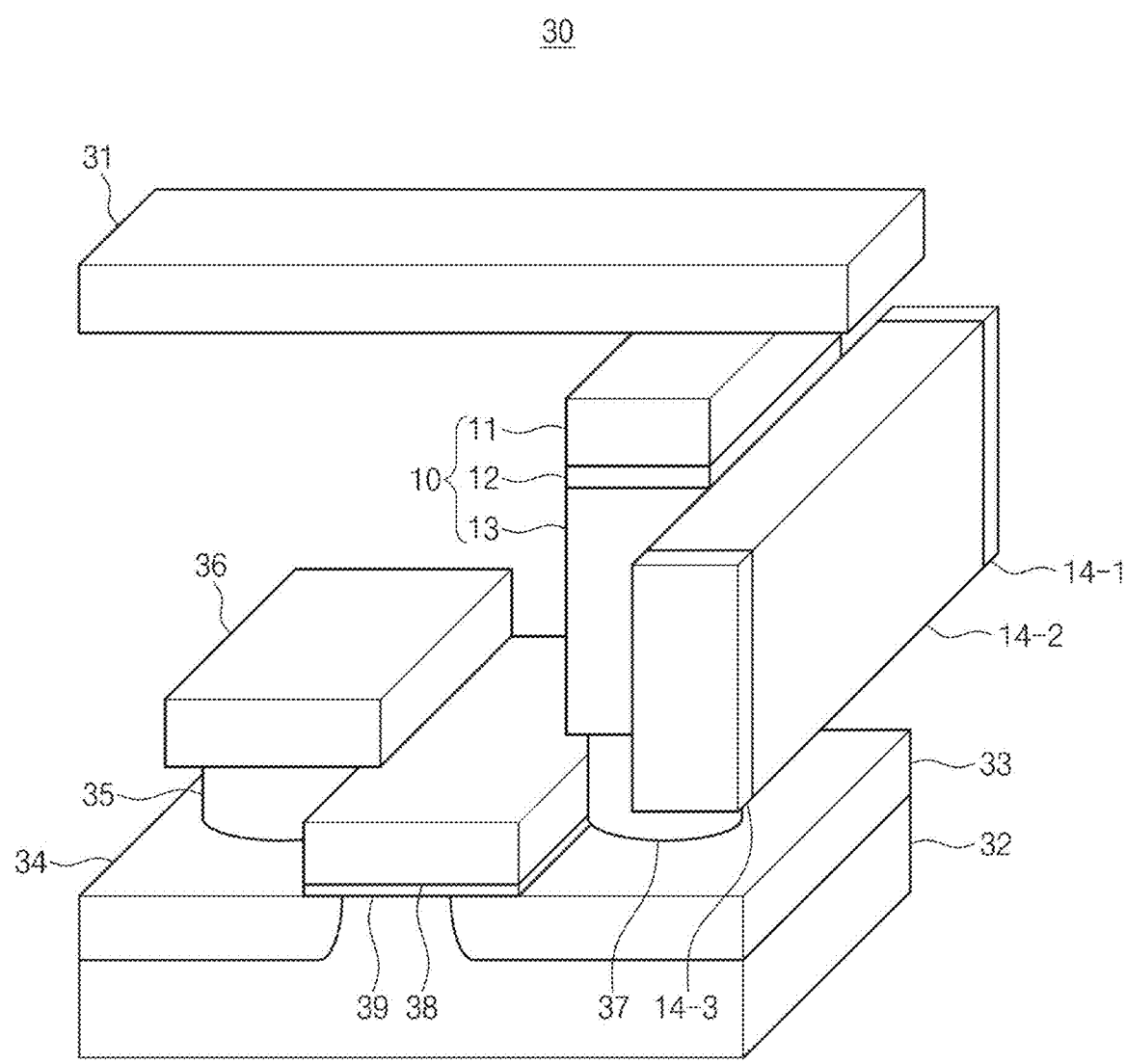
FIG. 7 illustrates a simplified perspective view showing a configuration of a magnetic tunnel junction element according an embodiment of the present inventive concepts.

Referring now to FIG. 7, a further embodiment of the invention illustrates a magnetic resistance memory device, which may use one of the magnetic tunnel junction elements described hereinabove. In particular, FIG. 7 illustrates a perspective view showing main components of an example of a magnetic resistance memory device, which includes a memory cell 30, a bit line 31, contact plugs 35 and 37, and a word line 38. Thus, as shown, the memory cell 30 of FIG. 7 includes a semiconductor substrate 32, first and second diffusion regions 33 and 34, a source line 36, a gate dielectric layer 39, and a magnetic tunnel junction element 10. The magnetic tunnel junction element 10 corresponds to a magnetic tunnel junction element 10 described hereinabove.

The magnetic resistance memory device may include a plurality of memory cells 30, a plurality of bit lines 31, and a plurality of word lines 38 in a matrix shape. And, the semiconductor substrate 32 may have the first and second diffusion regions 33 and 34 on a surface thereof. The first diffusion region 33, which is disposed spaced apart from the second diffusion region 34, may serve as a drain region, and the second diffusion region 34 may serve as a source region. The first diffusion region 33 is connected through the contact plug 37 to the magnetic tunnel junction element 10. The bit line 31 is disposed above a top surface of the semiconductor substrate 32 and is connected to the magnetic tunnel junction element 10. The bit line 31 is coupled to a read circuit (not shown). The second diffusion region 34 is connected through the contact plug 35 to the source line 36. The source line 36 is coupled to the read circuit (not shown).

The word line 38 is disposed on the semiconductor substrate 32 so as to vertically overlap a portion of the first diffusion region 33 and a portion of the second diffusion region 34. The gate dielectric layer 39 is interposed between the word line 38 and the semiconductor substrate 32. The word line 38 and the gate dielectric layer 39 can operate collectively as a part of a selection transistor, so that when the word line 38 is supplied with a sufficient voltage from a circuit (not shown), the word line 38 turns on the selection transistor. The bit line 31 reads data recorded in the magnetic resistance memory device from the magnetic tunnel junction element 10. When a voltage is applied between the first coupling terminal 14-1 and the second coupling terminal 14-3 of the magnetic tunnel junction element 10, spin torques of electrons are regularly arranged in a certain direction to change the magnetization direction of a ferromagnetic substance. Alternation of current direction may change values of data recorded in the magnetic resistance memory device.

The magnetic resistance memory device in accordance with the embodiment of FIG. 7 is constructed such that the SOT generator 14-1, 14-2, and 14-3 is disposed on a lateral surface of the free layer 13 to allow current to flow along a lateral surface of the SOT connection line 14-2, with the result that the magnetic resistance memory device may have simplified device structure, low write power, rapid write operation, and high reliability.

In addition, the present inventive concepts are not limited to the embodiments above, but may be appropriately changed without departing from the spirit of the present inventive concepts. For example, the magnetic resistance memory device according to the present inventive concepts may further include other layers that are correspondingly interposed between and do not affect the substrate, the pinned layer, the dielectric layer, and the free layer. For example, the magnetic resistance memory device according to the present inventive concepts may further include a layer to avoid lattice mismatching or lattice defect between layers. Moreover, the SOT generator (or SOT connection line) may have one of a plate shape, a thin-layer shape, and a linear shape, for example. Furthermore, the magnetic resistance memory device according to the present inventive concepts may further include a selection transistor to provide a plurality of SOT generators with current selected based on data to be recorded. Accordingly, by using magnetic tunnel junction elements and magnetic resistance memory devices in accordance with the present inventive concepts, an SOT generator can be disposed on a lateral surface of a free layer to allow current to flow along a lateral surface of the SOT generator. As a result, the magnetic tunnel junction elements and magnetic resistance memory devices may have simplified structure, low write power, rapid write operations, and high reliability.

In the drawings and specification, there have been disclosed typical preferred embodiments of the invention and, although specific terms are employed, they are used in a generic and descriptive sense only and not for purposes of limitation, the scope of the invention being set forth in the following claim.

What is claimed is:

1. A magnetic tunnel junction (MTJ) element, comprising:
   a free layer;
   a pinned layer on the free layer;
   a dielectric layer between the free layer and the pinned layer; and
   a spin orbit torque (SOT) generator in contact with at least a portion of a lateral surface of the free layer;
   wherein a first plane of the free layer, which extends between the SOT generator and the free layer, intersects a second plane of the free layer, which extends between the free layer and the dielectric layer; and
   wherein the SOT generator is configured to modulate current to flow in a first direction, the first direction being parallel to the lateral surface of the free layer and intersecting a stacking direction of the free layer, the dielectric layer and the pinned layer.

2. The MTJ element of claim 1, further comprising: a pair of electrodes each of which is connected to both ends of the SOT generator, wherein the pair of electrodes are spaced apart from each other in the first direction.

3. The MTJ element of claim 1, wherein the SOT generator comprises a metal selected from a group consisting of Pt, W, and Ta.

4. The MTJ element of claim 1, wherein the SOT generator includes a topological insulator.

5. The MTJ element of claim 4, wherein the topological insulator comprises at least one of BiTeSb and BiSb.

6. The MTJ element of claim 1, wherein the free layer is configured to have a polygonal pillar shape having a plurality of lateral surfaces; and wherein the SOT generator is in contact with at least one of the plurality of lateral surfaces of the free layer.

7. The MTJ element of claim 1,
   wherein the free layer is configured to have a polygonal pillar shape having a plurality of lateral surfaces thereon; and
   wherein the SOT generator contacts at least two lateral surfaces among the plurality of lateral surfaces of the free layer.

8. The MTJ element of claim 1, wherein the SOT generator comprises:
   a first SOT generator in contact with a first lateral surface of the free layer, which extends in the first direction; and
   a second SOT generator in contact with a second lateral surface of the free layer, which extends in the first direction, the second lateral surface of the free layer being opposite to the first lateral surface of the free layer;
   wherein the first SOT generator and the second SOT generator are spaced apart from each other in a second direction intersecting each of the first direction and the stacking direction; and
   wherein the first SOT generator and the second SOT generator have the same composition.

9. The MTJ element of claim 1, wherein the SOT generator comprises:
   a first SOT generator in contact with a first lateral surface of the free layer, which extends in the first direction; and
   a second SOT generator in contact with a second lateral surface of the free layer, which extends in the first direction;
   wherein the first SOT generator and the second SOT generator are spaced apart from each other in a second direction intersecting each of the first direction and the stacking direction; and
   wherein the first SOT generator and the second SOT generator comprise different materials.

10. The MTJ element of claim 1,
    wherein the SOT generator is in contact with both a first lateral surface of the free layer and a second lateral surface of the free layer;
    wherein the first lateral surface of the free layer extends in the first direction, and
    wherein the second lateral surface of the free layer extends in a second direction intersecting each of the first direction and the stacking direction.

11. The MTJ element of claim 1, wherein a thickness of the free layer is about 15 nm or greater.

12. The MTJ element of claim 1, wherein the free layer has a cylindrical shape; and wherein a bottom surface of the free layer has a diameter of about 10 nm or less.

13. The MTJ element of claim 1, wherein the free layer has a cylindrical shape; and wherein a thickness of the free layer is greater than a diameter of a bottom surface of the free layer.

14. The MTJ element of claim 1, wherein an area of the first plane is greater than an area of the second plane.

15. A magnetic resistance memory device, comprising:
    a magnetic tunnel junction element; and
    a plurality of electrodes electrically coupled to the magnetic tunnel junction element;
    wherein the magnetic tunnel junction element includes:
      a free layer;
      a pinned layer on the free layer;

a dielectric layer extending between the free layer and the pinned layer; and a spin orbit torque (SOT) generator in contact with at least a portion of a lateral surface of the free layer;

wherein a first plane of the free layer, which extends between the SOT generator and the free layer, intersects a second plane of the free layer, which extends between the free layer and the dielectric layer; and wherein the SOT generator is configured to allow current to flow in a first direction, the first direction being parallel to the lateral surface of the free layer and intersecting a stacking direction of the free layer, the dielectric layer, and the pinned layer.

16. An integrated circuit memory device, comprising:
a bit line; and
a magnetic tunnel junction (MTJ) element, comprising:
a free layer;
a pinned layer electrically coupled to the bit line, on the free layer;
a dielectric layer between the free layer and the pinned layer; and
a spin orbit torque (SOT) generator in contact with at least a portion of a lateral surface of the free layer, the SOT generator configured to modulate a magnetization direction of the free layer during at least one of an operation to write data to or read data from the MTJ element.

17. The memory device of claim 16, further comprising:
a semiconductor substrate having a transistor therein, the transistor including first and second diffusion regions within the semiconductor substrate and a gate electrode on the semiconductor substrate;
a source line electrically coupled to the second diffusion region; and
a word line electrically coupled to the gate electrode.

18. The memory device of claim 17, wherein the free layer is electrically coupled to the first diffusion region.

19. The memory device of claim 17, wherein the SOT generator comprises a topological insulator, which includes at least one of BiTeSb and BiSb, and/or comprises a metal selected from a group consisting of Pt, W, and Ta.

20. The memory device of claim 19, wherein the topological insulator contacts the free layer.

\* \* \* \* \*